(12) United States Patent
Lee et al.

(10) Patent No.: US 9,873,857 B2
(45) Date of Patent: Jan. 23, 2018

(54) CLEANING COMPOSITION

(71) Applicants: Samsung Display Co., Ltd., Yongin-si (KR); LTCAM CO., LTD., Pyeongtaek-si (KR)

(72) Inventors: Dongeon Lee, Yongin-si (KR); Jinho Ju, Yongin-si (KR); Junhyuk Woo, Yongin-si (KR); Seokho Lee, Yongin-si (KR)

(73) Assignees: SAMSUNG DISPLAY CO., LTD., Gyeonggi-Do (KR); LTCAM CO., LTD., Gyeonggi-Do (KR)

( * ) Notice: Subject to any disclaimer, the term of this patent is extended or adjusted under 35 U.S.C. 154(b) by 90 days.

(21) Appl. No.: 14/972,351

(22) Filed: Dec. 17, 2015

(65) Prior Publication Data

US 2016/0237384 A1 Aug. 18, 2016

(30) Foreign Application Priority Data

Feb. 16, 2015 (KR) .......................... 10-2015-0023424

(51) Int. Cl.
| | | |
|---|---|---|
| *C11D 7/50* | (2006.01) | |
| *C11D 11/00* | (2006.01) | |
| *C11D 7/32* | (2006.01) | |
| *C11D 7/26* | (2006.01) | |
| *C11D 7/08* | (2006.01) | |
| *H01L 21/02* | (2006.01) | |

(52) U.S. Cl.
CPC ............ *C11D 11/0047* (2013.01); *C11D 7/08* (2013.01); *C11D 7/265* (2013.01); *C11D 7/3209* (2013.01); *C11D 7/3245* (2013.01); *H01L 21/02057* (2013.01)

(58) Field of Classification Search
CPC .................................................. C11D 11/0047
See application file for complete search history.

(56) References Cited

U.S. PATENT DOCUMENTS

| | | | |
|---|---|---|---|
| 7,393,819 B2 | 7/2008 | Hsu | |
| 7,718,590 B2 | 5/2010 | Suzuki et al. | |
| 2005/0245422 A1 | 11/2005 | Yamada et al. | |
| 2006/0172907 A1* | 8/2006 | Kim | C11D 3/042 |
| | | | 510/175 |
| 2007/0105735 A1 | 5/2007 | Suga et al. | |
| 2008/0261847 A1* | 10/2008 | Visintin | H01L 21/02079 |
| | | | 510/176 |
| 2009/0131295 A1* | 5/2009 | Cui | H01L 21/02063 |
| | | | 510/176 |
| 2009/0212021 A1* | 8/2009 | Bernhard | C23F 1/28 |
| | | | 216/109 |

(Continued)

FOREIGN PATENT DOCUMENTS

| | | |
|---|---|---|
| KR | 1020050105105 | 11/2005 |
| KR | 1020080042945 | 5/2008 |
| KR | 1020140019226 | 2/2014 |

*Primary Examiner* — Gregory E Webb
(74) *Attorney, Agent, or Firm* — Cantor Colburn LLP (57) ABSTRACT

Provided is a cleaning composition, including, from about 0.01 weight % to about 10.0 weight % of a chelating agent, from about 0.01 weight % to about 3.0 weight % of an organic acid containing a carboxyl group, from about 0.01 weight % to about 2.0 weight % of an inorganic acid, from about 1.0 weight % to about 15.0 weight % of an amine and water in an amount sufficient to bring the total weight of the cleaning composition to 100 weight %.

12 Claims, 2 Drawing Sheets

(56) References Cited

U.S. PATENT DOCUMENTS

| | | | |
|---|---|---|---|
| 2010/0015807 A1* | 1/2010 | Kim | C09G 1/02 |
| | | | 438/693 |
| 2010/0019292 A1* | 1/2010 | Kim | C09K 13/02 |
| | | | 257/288 |
| 2011/0275164 A1* | 11/2011 | Visintin | H01L 21/02079 |
| | | | 438/4 |
| 2013/0203643 A1* | 8/2013 | Nakanishi | C11D 3/0042 |
| | | | 510/175 |
| 2014/0238953 A1* | 8/2014 | Kojima | H01L 24/03 |
| | | | 216/17 |

* cited by examiner

CLEANING COMPOSITION

This application claims priority to Korean Patent Application No. 10-2015-0023424, filed on Feb. 16, 2015, and all the benefits accruing therefrom under 35 U.S.C. § 119, the content of which in its entirety is herein incorporated by reference.

BACKGROUND

1. Field

Embodiments relate to a cleaning composition capable of cleaning a semiconductor apparatus or a display device.

2. Description of the Related Art

Highly integrated devices such as a semiconductor apparatus, a display device, etc. are sensitive to contamination by impurities such as dust, particles and the like. Therefore, cleaning processes are implemented to remove impurities at the time of manufacture.

Various types of cleaning processes may be carried out, such as an ultrasonic wave method, an air blowing method, a wet cleaning method using a basic cleaning composition, and the like. However, when such methods are used, metal in the device may corrode, thereby damaging microcircuits, electronic components, etc., which are present in the device.

SUMMARY

In exemplary embodiments, a cleaning composition is provided which includes, from about 0.01 weight percent (%) to about 10.0 weight % of a chelating agent, from about 0.01 weight % to about 3.0 weight % of an organic acid containing a carboxyl group, from about 0.01 weight % to about 2.0 weight % by weight of an inorganic acid, from about 1.0 weight % to about 15.0 weight % of an amine, and water in an amount sufficient to bring the total weight of the cleaning composition to 100 weight %.

In an exemplary embodiment, the cleaning composition may have a pH of about 2 to about 5.

In an exemplary embodiment, the chelating agent may be an amino acid.

In an exemplary embodiment, the chelating agent may include at least one of a glycine, an ethylenediaminetetraacetic acid ("EDTA") and a cyclohexanediaminetetraacetic acid ("CDTA").

In an exemplary embodiment, the organic acid containing the carboxyl group may include at least one of a lactic acid, a lactic acid alkyl ester, an acetic acid and an acetic acid alkyl ester.

In an exemplary embodiment, the amine may include at least one of 2-amino-2-methyl-1-propanol, 4-amino-2-methyl-5-diphosphomethylpyrimidine, 2-amino-2-methyl-3-hydroxy-(2-tetramethylsilane) and 2-amino-3-methylpyridine.

In an exemplary embodiment, the cleaning composition may be capable of being used in a process for cleaning a device including a copper layer and a silicon nitride layer.

In an exemplary embodiment, the cleaning composition may remove an organic particle, an inorganic particle and a metal particle.

In an exemplary embodiment, the device may be a semiconductor apparatus or a display device.

BRIEF DESCRIPTION OF THE DRAWINGS

The above and other aspects, advantages and features of this disclosure will become more apparent by describing in further detail embodiments thereof with reference to the accompanying drawings, in which.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In an exemplary embodiment, a cleaning composition may include about 0.01 weight % to about 10.0 weight % of a chelating agent, about 0.01 weight % to about 3.0 weight % of an organic acid containing a carboxyl group, about 0.01 weight % to about 2.0 weight % of an inorganic acid, about 1.0 weight % to about 15.0 weight % of an amine and about 0.01 weight % to about 98 weight % of deionized water. The cleaning composition may have a pH of about 2 to about 5.

The cleaning composition may be used to remove impurities which result during a process of manufacturing a semiconductor apparatus, a display device, and the like. For example, but without any limitation thereto, the cleaning composition may remove impurities from a device that includes at least one of a copper layer, a silicon nitride layer, and the like. The impurities may include an organic particle, an inorganic particle, a metal particle, and the like. The impurities may adhere to a surface of a material layer that includes a silicon oxide, a silicon nitride, etc. or a metal such as copper, silicon, a silicate, glass, and the like. In an exemplary embodiment, the cleaning liquid may prevent corrosion of copper, remove organic particles and inorganic particles adhered to surface of the copper layer, silicon oxide layer, silicon nitride layer, etc., and prevent the removed organic and inorganic particles from re-adhering. According to an exemplary embodiment, the cleaning liquid not only contacts the impurities but also contacts the material layer(s) included in the device and thereby prevent damages to the material layer(s) and re-adhesion of the impurities to the material layer(s).

The cleaning composition may include water as a solvent but is not limited thereto. The solvent may also be an alcohol such as ethanol, propanol, butanol, isopropanol and pentanol, or any combination thereof. The cleaning composition may further include an additional material that aids in the cleaning process, for example, but without any limitation thereto, an auxiliary agent such as a reducing agent, a buffering agent and a surface active agent having a pH of about 2 to about 5. The quantity of the auxiliary agent included in the cleaning composition is not particularly limited and may be properly adjusted depending on the type of auxiliary agent used.

The components of the cleaning composition according to exemplary embodiments are described in further detail below.

Chelating Agent

The cleaning composition may include from about 0.01 weight % to about 10.0 weight % of a chelating agent based on the total weight of the cleaning composition. The chelating agent may form a chelate compound by coupling to a metal particle adhered to the surface of the target to be cleaned, for example, a silicon nitride layer, glass, etc. As shown in equation I below, one mole of chelating agent $Y^{4-}$ may react with one mole of a metal ion regardless of the ionic valency of the metal ion $M^{n+}$ to form chelate compound $MY^{(4-n)-}$.

$$M^{n+} + Y^{4-} \rightarrow MY^{(4-n)-} \quad \text{(Equation I)}$$

The formed chelate compound $MY^{(4-n)-}$ may have a stable structure. Therefore, the metal particles may be effectively removed and re-adhesion of the metal particles may be effectively prevented.

The chelating agent may be coupled to the surface of a metal layer that has a positive charge and thereby neutralizes the surface of the metal layer. In an exemplary embodiment, the metal layer may be a copper layer. Hereinafter, an example of the metal layer as a copper layer is described.

The chelating agent may neutralize the surface of the copper layer by being coupled to the surface of the copper layer. Accordingly, the chelating agent may prevent metal particles which have been removed from a different layer, for example a silicon nitride layer, etc. from adhering to the surface of the copper layer.

The organic particles and the inorganic particles may be adhered to the surface of the copper layer by Van der Waals forces. A ligand of the chelating agent may diffuse on the copper layer through a capillary phenomenon and etch the surface of the copper layer. In this case, since the surface of the copper layer, the organic particles and the inorganic particles all have a positive charge, the electrostatic repulsion force therebetween may prevent re-adhesion.

In exemplary embodiments, the chelating agent may be an amino acid chelate. The amino acid may include at least one of a glycine, an ethylenediaminetetraacetic acid (EDTA) and a cyclohexanediaminetetraacetic acid (CDTA).

Organic Acid

The cleaning composition may include about 0.01 weight % to about 3.0 weight % of an organic acid based on the total weight of the cleaning composition. The organic acid may contain a carboxyl group. As shown in equation 2 below, the organic acid may be dissociated or ionized in the cleaning composition and generate a hydrogen ion $H^+$.

$$\text{Deionized water} + \text{organic acid} \rightarrow \text{organic acid}^- + H^+ \quad \text{(Equation 2)}$$

The organic acid may be used as a buffering agent, maintaining the pH of the cleaning composition, and thereby maintaining the chemical performance of each component.

The metal particles $M^+$ removed from the surface of the silicon nitride layer and the like due to the chelating agent and/or the inorganic acid may form an oxygen compound M-O compound by being coupled to the organic acid. The organic acid may contain a carboxyl group. In an exemplary embodiment, the organic acid includes at least one of a lactic acid, a lactic acid alkyl ester, an acetic acid and an acetic acid alkyl ester.

Therefore, re-adhesion of the impurities may be prevented.

Inorganic Acid

The cleaning composition may include from about 0.01 weight % to about 2.0 weight % of an inorganic acid, based on the total weight of the cleaning composition. The inorganic acid may be nitric acid The inorganic acid may concurrently remove any organic particles and inorganic particles that are adhered to the surface of the target layer for cleaning (for example, a silicon nitride layer, etc.) by etching or oxidizing the surface of the target layer. The inorganic acid may remove the organic particles by reacting with the carbon (C) atoms contained in the organic particles and thereby producing $CO_2$ and $H_2O$. The inorganic acid may adjust the pH of the cleaning composition.

Base Compound

The cleaning composition may further include from about 1.0 weight % to about 15.0 weight % of a base compound, based on the total weight of the cleaning composition. The base compound may be an amine. Organic particles may be removed as the $OH^-$ ion of the amine is used as an oxidizing agent. The amine may have a pH of from about 13 to about 14. The amine may act as a solvent for the chelating agent.

In exemplary embodiments, but without any limitation thereto, the amine may include at least one of 2-amino-2-methyl-1-propanol, 4-amino-2-methyl-5-diphosphomethyl-pyrimidine, 2-amino-2-methyl-3-hydroxy-(2-tetramethylsilane) and 2-amino-3-methylpyridine.

Deionized Water

The cleaning composition may include water in an amount sufficient for the total weight of the cleaning composition to be equal to 100% by weight. The water may be deionized water, which is neutralized by being deionized. The cleaning composition may include, from about 0.01 weight % to about 98 weight % of deionized water, based on the total weight of the cleaning composition. The water may increase the cleaning effect achieved by the cleaning composition by increasing the degree of activation of the components included in the cleaning composition.

Based upon the amount of deionized water included in the cleaning composition, a copper etch rate may be adjusted. As the amount of deionized water increases, the dilution ratio of the cleaning composition increases, while the copper etch rate decreases.

In an exemplary embodiment, the cleaning composition may have a pH of about 2 to about 5 by adjusting the content of each of the components in the cleaning composition, such as the organic acid, inorganic acid, and the like. The detergency of the cleaning composition, the degree of corrosion of the metal layer, whether impurities will be re-adhered, and the like, may be determined by the pH of the cleaning composition. If the cleaning composition has a pH of about 5.5 to about 14, a copper oxide layer may be formed on the surface of the copper layer, and localized corrosion may be induced due to formation of $HCuO_2^-$ in parallel reaction according to increase in pH. If the pH is 14 or greater, general corrosion may occur as copper is turned into $HCuO_2^-$. In an exemplary embodiment, the cleaning composition may have a pH of about 5.5 or less, specifically, a pH of about 2 to about 5. Accordingly, the impurities may be removed by wet etching. In exemplary embodiments, the cleaning composition has an enhanced impurity removal capability as compared to a conventional (prior art) neutral cleaning composition and/or basic cleaning composition. Not only may the impurities be effectively removed, but also corrosion of the copper layer, etc. may be prevented at the time of cleaning process. Re-adhesion of the impurities may also be prevented. Also, there is no need to use additional corrosion inhibitors.

Hereinafter, detailed embodiments and results are described. The embodiments are provided for illustration purposes only and the present invention should not be limited thereto.

Examples

Characteristics Evaluation 1 of Cleaning Composition

In a first embodiment (Example 1), a cleaning composition is manufactured by adding 4 weight % of ethylenediaminetetraacetic acid (EDTA) as the chelating agent, 1 weight % of an acetic acid as the organic acid containing a carboxyl group, 0.4 weight % of a nitric acid, 3.5 weight % of 2-amino-2-methyl-1-propanol as an amine, and 92 weight % of deionized water.

In a second embodiment (Example 2), the cleaning composition is manufactured by diluting the cleaning composition prepared in the first embodiment tenfold.

In comparative example 1, a cleaning composition is manufactured which includes 0.4 weight % of tetramethyl ammonium hydroxide as the chelating agent, with deionized water making up the remainder of the cleaning composition.

For comparative example 2, deionized water was used.

<Test Sample Manufacture and Cleaning>

First, a test sample was manufactured by cutting a copper layer mounted on a glass (silicon oxide) layer to a size of 4 cm×2 cm. The cleaning compositions of Examples 1 and 2 and comparative examples 1 and 2 were poured into 80 mL sized beakers, and the test samples were dipped into the cleaning composition contained within the beaker for a period of 20 seconds. Thereafter, the test sample was rinsed for 40 seconds with deionized water and dried with a nitrogen gas ($N_2$). The copper etch rate, wettability, particle removal and reverse adhesion characteristics, damages to copper and residue, organic dust removal capability, and metal impurity removal capability of each of the cleaning compositions was evaluated.

For an evaluation of spreadability, the cleaning compositions of Examples 1 and 2 and comparative examples 1 and 2 were dropped onto the test sample and an area across which they spread on the surface was measured. For an evaluation of foaming characteristics, 35 g of each of the cleaning compositions of Examples 1 and 2 and comparative examples 1 and 2 were placed in glass vials, and after the glass vials were shaken ten times, the height of the bubbles and the time to de-foam were compared. The results are as shown in Table 1 below.

TABLE 1

| | Comparative example 2 | Comparative example 1 | Example 1 | Example 2 |
|---|---|---|---|---|
| Copper etch rate | 0.395 Å/min* (25° C.) | 4.99 Å/min (25° C.) | 3.9 Å/min (25° C.) | 1.62 Å/min (25° C.) |
| Wettability | O** | X | O | O |
| Spreadability | 4.0 nm | 8.0 nm | 7.0 nm | 7.0 nm |
| Foaming characteristics | ⊚† | ○ | ⊚ | ⊚ |
| Particle removal and reverse adhesion characteristics | Δ | Δ | ⊚ | ⊚ |
| Copper damage and residue | Cu No corrosion | Cu Corrosion | Cu No corrosion | Cu No corrosion |
| Organic dust removal capability | ○ | ○ | ⊚ | ⊚ |
| Metal impurities removal capability | Δ | ⊚ | ⊚ | ⊚ |

*Angstroms per minute (Å/min).
**O: wettable; X: non-wettable.
†⊚: excellent,
○: good,
Δ: not bad,
X: bad Referring to Table 1, it was confirmed the copper etch rate of the cleaning composition in Example 2 was lower than the copper etch rate of the cleaning composition in Example 1. Thus, the higher the dilution rate, the lower the copper etch rate. Also, it was confirmed that the cleaning composition in the Example 1 shows excellent capability in particle removal, reverse adhesion prevention, copper corrosion prevention, organic dust removal and metal impurities removal.

Furthermore, wettability, spreadability, and foaming characteristics play an important role, in addition to particle removal capability. As the contact angle for a droplet of the cleaning liquid increases, the spreadability decreases. The area where the test sample and the cleaning liquid droplet contact each other is also reduced. As a result, detergency decreases. Therefore, it was confirmed that the cleaning composition according to the Example 1 has superior detergency because the wettability and spreadability were good and the foaming characteristics were small.

Characteristics Evaluation 2 of Cleaning Composition
<Manufacture of Cleaning Composition>

A cleaning composition is manufactured by adding 4.0 weight % EDTA as the chelating agent, 1.0 weight % acetic acid as the organic acid containing a carboxyl group, 0.4 weight % nitric acid as the inorganic acid, 3.6 weight % 2-amino-2-methyl-1-propanol as the amine, and 92 weight % deionized water.

The cleaning composition was manufactured by diluting the cleaning composition two fold (Example 1), four fold (Example 2), ten fold (Example 3) and fifteen (15) fold (Example 4).

For comparative example 1, a cleaning composition was manufactured which includes 0.4 weight % tetramethyl ammonium hydroxide (TMAH) as the chelating agent with the remainder being deionized water.

For comparative example 2, deionized water alone was used.

<Test Sample Manufacture and Cleaning>

First, a test sample was manufactured by cutting copper mounted on glass (silicon oxide layer) into a section 4 cm×2 cm. The cleaning composition of Examples 1 to 4 and comparative examples 1 and 2 was poured into an 80 mL beaker, and the test sample was dipped into the cleaning composition contained in the beaker for a period of 20 seconds. Thereafter, the test sample was rinsed for 40 seconds with deionized water and dried with a nitrogen gas ($N_2$). The glass etch rate, pH and the number of the remaining particles of each of the cleaning composition are measured. The results are shown in Table 2 below.

TABLE 2

| | Etch rate (Å/min) | pH | Particle removal rate (%) (based on 100%) |
|---|---|---|---|
| Example 1 | 4.91 | 4.21 | 94 |
| Example 2 | 2.44 | 4.12 | 91 |
| Example 3 | 1.62 | 4.11 | 87 |
| Example 4 | 1.37 | 4.20 | 83 |
| Comparative example 1 | 1.86 | 12.52 | 75 |
| Comparative example 2 | 1.19 | 6.23 | 20 |

Referring to Table 2, it was confirmed that the etch rate of the copper layer decreased as the dilution rate increased. Therefore, depending on the etch rate required in the process, the dilution rate can be determined. Also, it was confirmed that a basic cleaning composition such as the one shown in comparative example 1, has a low fine particle removal capability.

Characteristics Evaluation 3 of Cleaning Composition
<Manufacture of Cleaning Composition>

In a first Example, a cleaning composition was manufactured by adding 4.0 weight % EDTA as the chelating agent, 1.0 weight % acetic acid as the organic acid containing a carboxyl group, 0.4 weight % nitric acid as the inorganic acid, 3.6 weight % 2-amino-2-methyl-1-propanol as an amine, and 92 weight % deionized water. Thereafter, the cleaning composition was diluted 14 fold with deionized water.

For comparative example 1, a cleaning composition was manufactured by adding 4.0 weight % EDTA as the chelating agent, 1.0 weight % acetic acid as the organic acid containing a carboxyl group, 0.4 weight % a nitric acid as the inorganic acid, 3.6 weight % TMAH the amine, and 2 weight % deionized water in 92%. Thereafter, the cleaning composition was diluted 14 fold with deionized water. That is, the amine in Example 1 was replaced by TMAH in order to manufacture the cleaning composition in comparative example 1.

For comparative example 2, deionized water was used.

<Test Sample Manufacture and Cleaning>

First, a test sample was manufactured by cutting copper layer mounted on glass (silicon oxide layer) into 4 cm×2 cm. The cleaning composition of Example 1 and comparative examples 1 and 2 were poured into an 80 mL beaker, and the test sample was dipped into the cleaning composition contained in the beaker for a period of 20 seconds. Thereafter, the test sample was rinsed for 40 seconds with deionized water and dried with a nitrogen gas ($N_2$). The glass particles that remained in each of the test samples were counted, and the removal rate was calculated by comparing the number of the glass particles present prior to the cleaning process to the number of the glass particles present after the cleaning process. The results are shown in Table 3 below.

TABLE 3

| | Number of particles before cleaning | Number of particles after cleaning | Removal rate (%) |
|---|---|---|---|
| Example 1 | 450 | 63 | 86% |
| Comparative example 1 | 551 | 160 | 71% |
| Comparative example 2 | 339 | 992 | 0% (192% increase) |

Referring to Table 3, it was confirmed that the rate of particle removal was increased in the case of using 2-amino-2-methyl-1-propanol as the amine as compared to the case of using TMAH as the amine. Also, according to comparative example 2, it was confirmed that the number of the glass particles even increased 192%.

Characteristics Evaluation 4 of Cleaning Composition
<Manufacture of Cleaning Composition>

For Example 1, a cleaning composition was manufactured by adding 4.0 weight % EDTA in 4.0% as the chelating agent, 1.0 weight % acetic acid as the organic acid containing a carboxyl group, 0.4 weight % nitric acid in 0.4% as the inorganic acid, 3.6 weight % 2-amino-2-methyl-1-propanol as the amine, and 92 weight % deionized water.

For Example 2, the cleaning composition of Example 1 was diluted ten fold with deionized water.

For comparative example 1, a cleaning composition was manufactured which included 0.4 weight % TMAH as the chelating agent and deionized water for the remainder.

For comparative example 2, deionized water was used.

<Test Sample Manufacture and Cleaning>

First, a first test sample was manufactured by cutting copper mounted on glass (silicon oxide layer) into 4 cm×2 cm. Also, a second test sample was manufactured by cutting silicon nitride layer into 4 cm×2 cm. The cleaning composition of Examples 1 and 2 and comparative examples 1 and 2 were poured into an 80 mL beaker, and the first and second test samples were dipped into the cleaning compositions contained in the beakers for a period of 20 seconds. Thereafter, the test sample were rinsed for 40 seconds with deionized water and dried with a nitrogen gas ($N_2$). The glass particles that remained in each of the test samples were counted, and the removal rate was calculated by comparing the number of the glass particles prior to the cleaning process with the number of the glass particles after the cleaning process. The results are shown in Table 4 below.

TABLE 4

|  |  | Number of particles before cleaning | Number of particles after cleaning | Removal rate (%) |
|---|---|---|---|---|
| First test sample (Cu glass) | Example 1 | 529 | 60 | 88.7% |
|  | Example 2 | 590 | 125 | 78.8% |
|  | Comparative example 1 | 537 | 261 | 51.4% |
|  | Comparative example 2 | 578 | 690 | 0% |
| Second test sample (Si—N) | Example 1 | 499 | 92 | 81.6% |
|  | Example 2 | 479 | 131 | 72.7% |
|  | Comparative example 1 | 412 | 234 | 43.2% |
|  | Comparative example 2 | 460 | 368 | 20.0% |

Referring to Table 4, it was confirmed that the cleaning composition of Examples 1 and 2 had superior inorganic contaminant removal capability with respect to a specific layer. Particularly, it was confirmed that the glass particle removal capability with respect to the copper layer and the silicon nitride layer was excellent.

Characteristics Evaluation 5 of Cleaning Composition
<Manufacture of Cleaning Composition>

For Example 1, a cleaning composition was manufactured by adding 4.0 weight % EDTA as the chelating agent, 1.0 weight % acetic acid as the organic acid containing a carboxyl group, 0.4 weight % nitric acid as the inorganic acid, 3.6 weight % 2-amino-2-methyl-1-propanol as the amine, and 92 weight % deionized water. Thereafter, the cleaning composition was diluted ten fold with deionized water.

For comparative example 1, a cleaning composition was manufactured which included 0.4 weight % TMAH with the remainder being deionized water.

For comparative example 2, deionized water was used.
<Test Sample Manufacture and Cleaning>

First, a test sample was manufactured by cutting copper mounted on glass (silicon oxide layer) into 4 cm×2 cm. The test sample was treated with first to third contamination sources. Thereafter, the organic or inorganic particles of each of the test samples are counted. For the first contamination source, nickel powder was used as an inorganic contamination source. For the second contamination source, erucamide was used as an organic contamination source. For the third contamination source, soybean oil was used as the organic contamination source. Thereafter, the cleaning composition of Example 1 and comparative examples 1 and 2 were poured into an 80 mL beaker. The test samples treated with the first to third contamination sources were dipped into the cleaning compositions contained in the beakers for 20 seconds. Thereafter, the test samples were rinsed for 40 seconds with deionized water and dried with a nitrogen gas ($N_2$). The organic or inorganic particles remaining in each of the test samples were counted, and the removal rate was calculated by comparing the number of the particles present before the cleaning process with the number of the particles present after the cleaning process. The results are shown in Table 5 below.

TABLE 5

|  |  | Number of Particles Before cleaning | Number of Particles After cleaning | Removal rate (%) |
|---|---|---|---|---|
| First contamination source (Nickel powder) | Example 1 | 494 | 116 | 76.5% |
|  | Comparative example 1 | 542 | 294 | 45.8% |
|  | Comparative example 2 | 434 | 617 | 0% |
| Second contamination source (Erucamide) | Example 1 | 579 | 156 | 73.1% |
|  | Comparative example 1 | 601 | 451 | 25.0% |
|  | Comparative example 2 | 312 | 446 | 0% |
| Third contamination source (Soybean oil) | Example 1 | 610 | 71 | 88.4% |
|  | Comparative example 1 | 672 | 422 | 37.2% |
|  | Comparative example 2 | 493 | 428 | 13.2% |

Referring to Table 6, it was confirmed that the cleaning composition according to Example 1 had superior organic particle and inorganic particle removal effects as compared to the cleaning composition of comparative examples 1 and 2.

Characteristics Evaluation 6 of Cleaning Composition
<Manufacture of Cleaning Composition>

For Example 1, a cleaning composition was manufactured by adding 4.0 weight % EDTA as the chelating agent, 1.0 weight % acetic acid as the organic acid containing a carboxyl group, 0.4 weight % a nitric acid as the inorganic acid, 3.6 weight % 2-amino-2-methyl-1-propanol as the amine, and 92 weight % deionized water. Thereafter, the cleaning composition was diluted ten fold with deionized water.

For comparative example 1, a cleaning composition was manufactured by adding 4.0 weight % EDTA as the chelating agent, 1.0 weight % acetic acid as the organic acid containing a carboxyl group, 0.4 weight % nitric as the inorganic acid, 10.0 weight % 2-amino-2-methyl-1-propanol as the amine, and 92 weight % deionized water. Thereafter, the cleaning composition was diluted 15 fold with deionized water.

For comparative example 2, a cleaning composition is manufactured by adding 4.0 weight % EDTA as the chelating agent, 1.0 weight % acetic acid as the organic acid containing a carboxyl group, 3 weight % hydrochloric acid as the inorganic acid, 10.0 weight % 2-amino-2-methyl-1-propanol as the amine, and 92 weight % deionized water. Thereafter, the composition was diluted 15 fold with deionized water.

For comparative example 3, deionized water w.
<Test Sample Manufacture and Cleaning>

First, a test sample was manufactured by cutting copper mounted on glass (silicon oxide layer) into 4 cm×2 cm. Thereafter, the cleaning composition of Example 1 and comparative examples 1 to 3 was poured into an 80 mL beaker. The test sample was dipped into the cleaning composition contained in the beaker for time periods of 5 minutes, 15 minutes and 30 minutes. Thereafter, using inductively coupled plasma spectrometry ("ICP"), the copper elution quantity of the cleaning composition of Example 1 and comparative examples 1 to 3 contained in each beaker were compared. The results are shown in Table 6 below.

TABLE 6

| Cu elution time | 5 minutes (ppb*) | 15 minutes (ppb) | 30 minutes (ppb) |
|---|---|---|---|
| Example 1 | 0.090 | 0.116 | 0.485 |
| Comparative example 1 | 0.814 | 1.164 | 2.144 |
| Comparative example 2 | 0.230 | 0.561 | 0.954 |
| Comparative example 3 | 0.114 | 0.204 | 0.512 |

*ppb; parts per billion.

Referring to Table 6, when the cleaning composition in Example 1 whose pH was 8 or less was used, after Cu flows out from the copper layer, it was re-adhered, and therefore the elution quantity was increased by only a small amount. That is, it was confirmed that damages to the surface of the copper layer were small. If the cleaning composition of comparative example 1 whose pH is 13 or greater is used, the surface of the copper layer was corroded into $HCuO_2^-$ in a strongly alkaline state. Therefore, the copper elution quantity increased greatly. That is, it was confirmed that the damages were significant due to corrosion of the surface of the copper layer.

Characteristics Evaluation 7 of Cleaning Composition
<Manufacture of Cleaning Composition>

For Example 1, a cleaning composition was manufactured by adding 4.0 weight % EDTA as the chelating agent, 1.0 weight % acetic acid as the organic acid containing a carboxyl group, 0.4 weight % nitric acid as the inorganic acid, 3.6 weight % 2-amino-2-methyl-1-propanol as the amine, and 92 weight % deionized water. Thereafter, the cleaning composition was diluted ten fold with deionized water.

For comparative example 1, a cleaning composition was manufactured by adding 4.0 weight % EDTA as the chelating agent, 1.0 weight % acetic acid as the organic acid containing a carboxyl group, 0.4 weight % nitric acid as the inorganic acid, 10.0 weight % 2-amino-2-methyl-1-propanol as the amine, and 92 weight % deionized water. Thereafter, the cleaning composition was diluted ten times with deionized water.

In comparative example 2, a cleaning composition was manufactured which includes 0.4 weight % of TMAH with deionized water for the remainder.

For comparative example 3, deionized water was used.
<Test Sample Manufacture and Cleaning>

First, a test sample was manufactured by cutting copper layer mounted on glass (silicon oxide layer) into 4 cm×2 cm. Thereafter, the cleaning composition of Example 1 and comparative examples 1 to 3 was poured into an 80 mL beaker. The test sample was dipped into the cleaning composition contained in the beaker for 60 seconds. Thereafter, the test sample was rinsed for 40 seconds with deionized water and dried with a nitrogen gas ($N_2$). The copper surface was examined by magnifying the surface 70,000 times using a field emission scanning electron microscope ("FE-SEM"). The damages to the copper layer surface were compared.

Figure 1A:
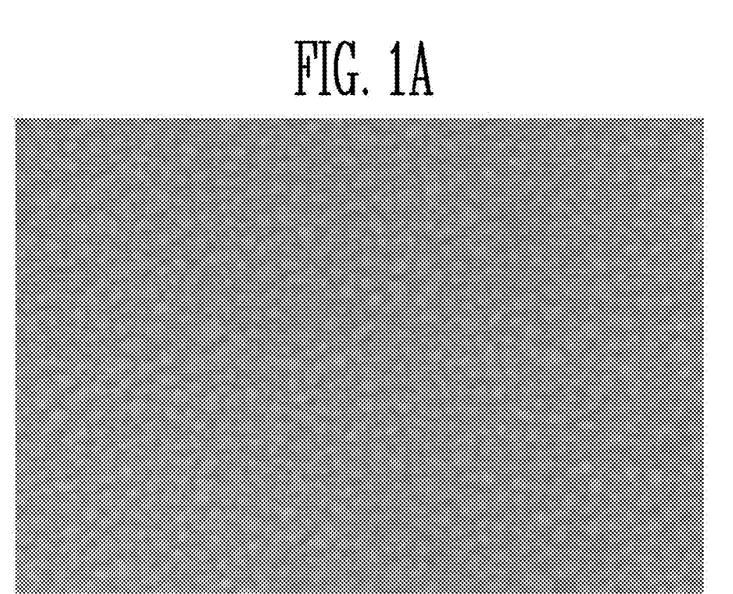
FIG. 1A is a photograph of the results obtained using the cleaning composition of Example 1 in accordance with characteristics evaluation 7.
Figure 1B:
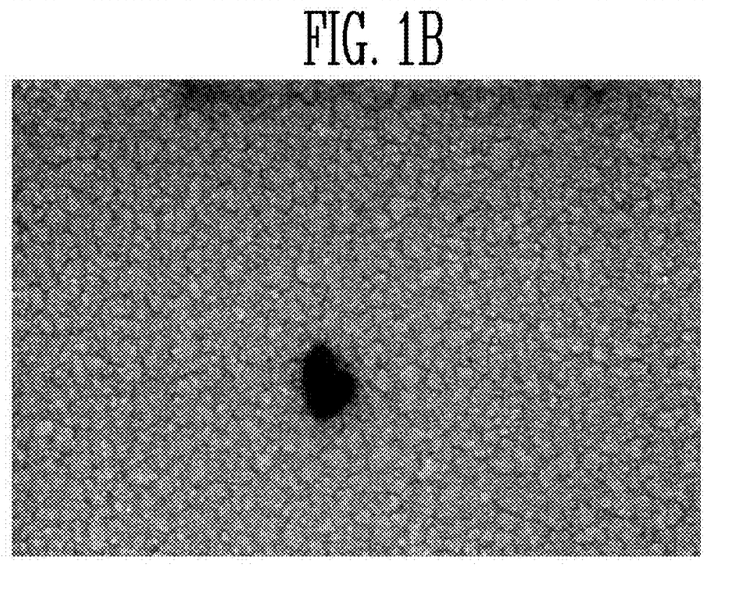
FIG. 1B is a photograph of the results obtained using the cleaning composition of Comparative Example 1 in accordance with characteristics evaluation 7.
Figure 1C:
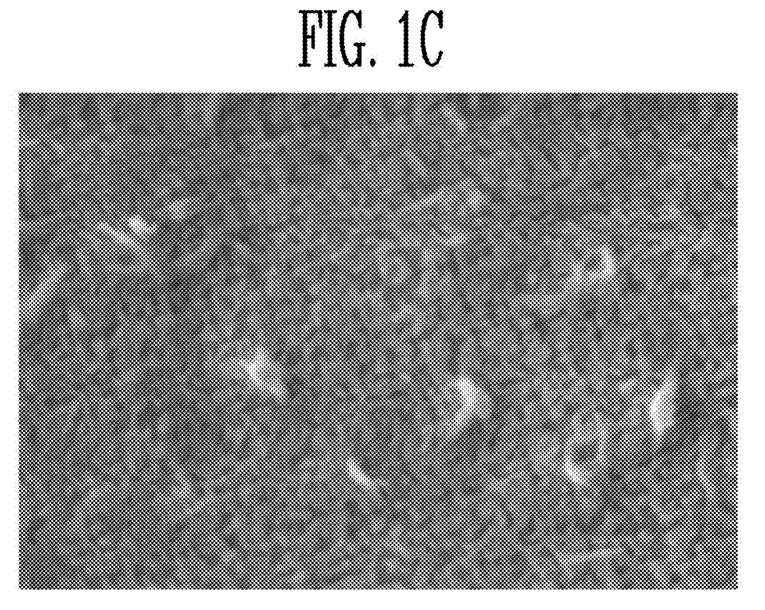
FIG. 1C is a photograph of the results obtained using the cleaning composition of Comparative Example 2 in accordance with characteristics evaluation 7.
Figure 1D:
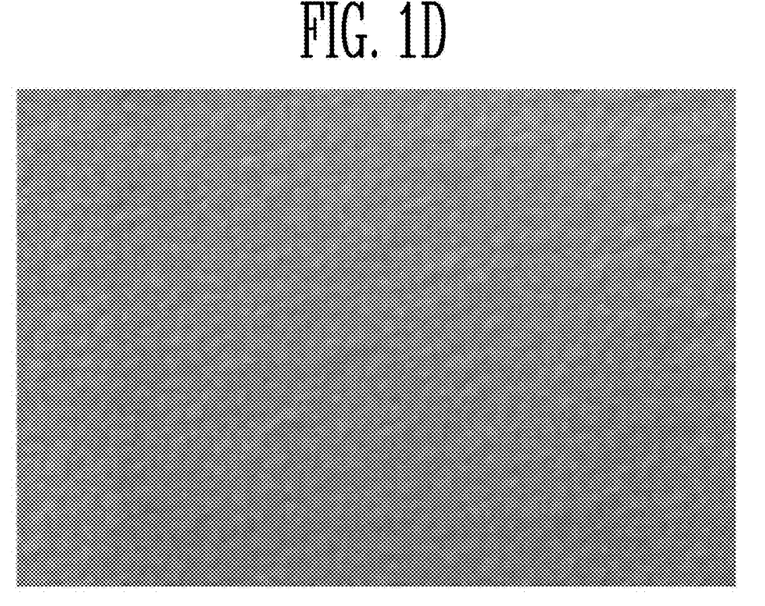
FIG. 1D is a photograph of the results obtained using the cleaning composition of Comparative Example 3 in accordance with characteristics evaluation 7.

FIG. 1A is a measurement of the results using the cleaning composition in Example 1. FIG. 1B is a measurement of the results using the cleaning composition in comparative example 1. FIG. 1C is a measurement of the results using the cleaning composition in comparative example 2. FIG. 1D is measurement of the results using the cleaning composition in comparative example 3.

Referring to FIG. 1A, when the cleaning composition in Example whose pH is 5.5 or less was used, conventional wet etching which ionizes the copper surface with $Cu^{2+}$ was induced. As a result, it was confirmed that there were no damages to the surface. However, referring to FIGS. 1B to 1D, when the cleaning compositions in comparative examples 1 to 3 were used whose pH was from 5.5 to 14, it was confirmed that irregular damages were made to the surface of the glass. It was determined that local corrosion had occurred due to formation of a copper oxide layer on the copper layer surface and an $HCuO_2^-$ parallel reaction as a result of increase in pH.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A cleaning composition, comprising:
    about 0.01 weight % to about 10.0 weight % of a chelating agent;
    about 0.01 weight % to about 3.0 weight % of an organic acid having a carboxyl group;
    about 0.01 weight % to about 2.0 weight % of an inorganic acid, wherein the inorganic acid comprises nitric acid;
    about 1.0 weight % to about 15.0 weight % of an amine, wherein the amine comprises at least one of 4-amino-2-methyl-5-diphosphomethylpyrimidine, 2-amino-2-methyl-3-hydroxy-(2-tetramethylsilane), and 2-amino-3-methylpyridine; and
    water, wherein the total weight of the cleaning composition is 100 weight %.

2. The cleaning composition as claimed in claim 1, wherein the cleaning composition has a pH of about 2 to about 5.

3. The cleaning composition as claimed in claim 1, wherein the chelating agent comprises an amino acid.

4. The cleaning composition as claimed in claim 1, wherein the chelating agent comprises at least one of a glycine, an ethylenediaminetetraacetic acid (EDTA) and a cyclohexanediaminetetraacetic acid (CDTA).

5. The cleaning composition as claimed in claim 1, wherein the organic acid having the carboxyl group comprises at least one of a lactic acid, a lactic acid alkyl ester, an acetic acid, and an acetic acid alkyl ester.

6. The cleaning composition as claimed in claim 1, wherein the cleaning composition is capable of being used in a process for cleaning a device comprising at least one of a copper layer and a silicon nitride layer.

7. The cleaning composition as claimed in claim 6, wherein the cleaning composition removes an organic particle, an inorganic particle and a metal particle.

8. The cleaning composition as claimed in claim 6, wherein the device is a semiconductor apparatus or a display device.

9. A cleaning composition, consisting of:
about 0.01 weight % to about 10.0 weight % of a chelating agent;
about 0.01 weight % to about 3.0 weight % of an organic acid having a carboxyl group;
about 0.01 weight % to about 2.0 weight % of an inorganic acid, wherein the inorganic acid comprises nitric acid;
about 1.0 weight % to about 15.0 weight % of an amine; and
water, wherein the total weight of the cleaning composition is 100 weight %.

10. The cleaning composition as claimed in claim 9, wherein the chelating agent is glycine, ethylenediaminetetraacetic acid (EDTA), cyclohexanediaminetetraacetic acid (CDTA), or a combination thereof.

11. The cleaning composition as claimed in claim 9, wherein the organic acid having the carboxyl group is lactic acid, lactic acid alkyl ester, an acetic acid, an acetic acid alkyl ester, or a combination thereof.

12. The cleaning composition as claimed in claim 9, wherein the amine is 2-amino-2-methyl-1-propanol, 4-amino-2-methyl-5-diphosphomethylpyrimidine, 2-amino-2-methyl-3-hydroxy-(2-tetramethylsilane), 2-amino-3-methylpyridine, or a combination thereof.

* * * * *